(12) United States Patent
Matsumura et al.

(10) Patent No.: US 7,646,103 B2
(45) Date of Patent: Jan. 12, 2010

(54) DICING/DIE-BONDING FILM, METHOD OF FIXING CHIPPED WORK AND SEMICONDUCTOR DEVICE

(75) Inventors: Takeshi Matsumura, Ibaraki (JP); Masaki Mizutani, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 521 days.

(21) Appl. No.: 11/369,931

(22) Filed: Mar. 7, 2006

(65) Prior Publication Data
US 2006/0148131 A1 Jul. 6, 2006

Related U.S. Application Data
(62) Division of application No. 10/678,855, filed on Oct. 3, 2003, now Pat. No. 7,060,339.

(30) Foreign Application Priority Data
Oct. 15, 2002 (JP) ............................. 2002-299930

(51) Int. Cl.
*H01L 21/00* (2006.01)
(52) U.S. Cl. .................. 257/782; 257/783; 257/620
(58) Field of Classification Search ................ 257/782, 257/783, 620
See application file for complete search history.

(56) References Cited

U.S. PATENT DOCUMENTS

| | | |
|---|---|---|
| 4,664,739 A | 5/1987 | Aurichio |
| 4,687,693 A | 8/1987 | Sheyon et al. |
| 4,961,804 A | 10/1990 | Aurichio |
| 5,098,501 A | 3/1992 | Nishiguchi |
| 5,304,418 A | 4/1994 | Akada et al. |
| 5,476,565 A | 12/1995 | Akada et al. |
| 5,525,422 A | 6/1996 | Spies et al. |
| 5,705,016 A * | 1/1998 | Senoo et al. ............... 156/289 |

(Continued)

FOREIGN PATENT DOCUMENTS
EP  0 150 882 A1  8/1985

(Continued)

OTHER PUBLICATIONS
Decision of Refusal issued on the related Japanese Patent Application No. 2003-152659, dated Oct. 30, 2007.

(Continued)

*Primary Examiner*—Laura M Menz
(74) *Attorney, Agent, or Firm*—Knobbe Martens Olson & Bear LLP (57) ABSTRACT

A dicing/die-bonding film including a pressure-sensitive adhesive layer (2) on a supporting base material (1) and a die-bonding adhesive layer (3) on the pressure-sensitive adhesive layer (2), wherein a releasability in an interface between the pressure-sensitive adhesive layer (2) and the die-bonding adhesive layer (3) is different between an interface (A) corresponding to a work-attaching region (3a) in the die-bonding adhesive layer (3) and an interface (B) corresponding to a part or a whole of the other region (3b), and the releasability of the interface (A) is higher than the releasability of the interface (B). The dicing/die-bonding film is excellent in balance between retention in dicing a work and releasability in releasing its diced chipped work together with the die-bonding adhesive layer.

7 Claims, 3 Drawing Sheets

U.S. PATENT DOCUMENTS

| | | | |
|---|---|---|---|
| 5,844,348 | A | 12/1998 | Gamo |
| 5,888,606 | A * | 3/1999 | Senoo et al. ............... 428/66.6 |
| 6,007,920 | A | 12/1999 | Umehara et al. |
| 6,140,151 | A | 10/2000 | Akram |
| 6,171,163 | B1 | 1/2001 | Seko et al. |
| 6,245,593 | B1 | 6/2001 | Yoshihara et al. |
| 6,258,426 | B1 | 7/2001 | Yamamoto et al. |
| 6,398,892 | B1 | 6/2002 | Noguchi et al. |
| 6,457,220 | B1 | 10/2002 | Hamano |
| 6,528,330 | B2 | 3/2003 | Iketani |
| 6,548,327 | B2 | 4/2003 | De Pauw et al. |
| 6,938,783 | B2 | 9/2005 | Chung |
| 6,977,024 | B2 | 12/2005 | Yamazaki et al. |
| 7,054,161 | B1 | 5/2006 | James |
| 7,060,339 | B2 * | 6/2006 | Matsumura et al. ......... 428/66.6 |
| 7,135,224 | B2 * | 11/2006 | Sumi et al. ............. 428/355 EP |
| 7,147,920 | B2 | 12/2006 | Shiobara et al. |
| D549,189 | S | 8/2007 | Misumi et al. |
| 7,309,925 | B2 * | 12/2007 | Matsumura et al. ......... 257/797 |
| 7,429,522 | B2 * | 9/2008 | Matsumura et al. ......... 438/462 |
| 7,449,226 | B2 * | 11/2008 | Matsumura et al. ........ 428/66.6 |
| 7,452,752 | B2 * | 11/2008 | Noda et al. ................. 438/114 |
| 7,508,081 | B2 * | 3/2009 | Matsumura et al. ......... 257/782 |
| 2002/0001670 | A1 | 1/2002 | Pauw et al. |
| 2002/0014465 | A1 | 2/2002 | Chung |
| 2002/0042189 | A1 | 4/2002 | Tanaka |
| 2003/0207479 | A1 | 11/2003 | Border et al. |
| 2003/0226640 | A1 | 12/2003 | Yamazaki et al. |
| 2004/0105990 | A1 | 6/2004 | Shiobara et al. |
| 2004/0230000 | A1 * | 11/2004 | Misumi et al. ............... 525/128 |
| 2004/0232563 | A1 * | 11/2004 | Sumi et al. .................. 257/783 |
| 2004/0241910 | A1 * | 12/2004 | Matsumura et al. ......... 438/118 |
| 2005/0046042 | A1 * | 3/2005 | Matsumura et al. ......... 257/782 |
| 2005/0139973 | A1 * | 6/2005 | Matsumura et al. ......... 257/678 |
| 2005/0208736 | A1 * | 9/2005 | Matsumura et al. ......... 438/460 |
| 2005/0224978 | A1 * | 10/2005 | Kawate et al. ............... 257/753 |
| 2005/0227064 | A1 * | 10/2005 | Jin ............................ 428/343 |
| 2006/0029762 | A1 | 2/2006 | Chung |
| 2006/0148131 | A1 * | 7/2006 | Matsumura et al. ......... 438/113 |
| 2006/0252234 | A1 * | 11/2006 | Saiki .......................... 438/464 |
| 2006/0257651 | A1 | 11/2006 | Shintani et al. |
| 2007/0003758 | A1 * | 1/2007 | Jin ............................ 428/343 |
| 2007/0077685 | A1 * | 4/2007 | Noda et al. ................. 438/107 |
| 2007/0090299 | A1 * | 4/2007 | Kozakai et al. ......... 250/370.01 |
| 2007/0104972 | A1 * | 5/2007 | Shinohara et al. ........... 428/522 |
| 2007/0120271 | A1 * | 5/2007 | Kozakai et al. ............. 257/779 |
| 2007/0137782 | A1 * | 6/2007 | Matsumura et al. ...... 156/275.7 |
| 2007/0218299 | A1 * | 9/2007 | Azechi ....................... 428/447 |
| 2008/0088036 | A1 * | 4/2008 | Matsumura et al. ......... 257/783 |
| 2008/0090085 | A1 * | 4/2008 | Kawate et al. ............... 428/413 |
| 2008/0108721 | A1 * | 5/2008 | Ha et al. ....................... 522/33 |

FOREIGN PATENT DOCUMENTS

| | | |
|---|---|---|
| EP | 0 134 606 B1 | 3/1989 |
| EP | 0 550 014 A2 | 7/1993 |
| EP | 550014 A2 * | 7/1993 |
| EP | 0 571 649 A1 | 12/1993 |
| EP | 0 588 180 A1 | 3/1994 |
| EP | 0 786 802 | 7/1997 |
| EP | 0792 756 A2 | 9/1997 |
| EP | 0 884 766 A2 | 12/1998 |
| EP | 0 976 802 A1 | 2/2000 |
| EP | 1 411 547 A2 | 4/2004 |
| EP | 1411547 A2 * | 4/2004 |
| EP | 1 482 546 A2 | 12/2004 |
| EP | 1583144 A2 * | 10/2005 |
| GB | 2 340 772 A | 3/2000 |
| JP | 60-057642 | 4/1985 |
| JP | 60-196956 | 10/1985 |
| JP | 61-263136 | 11/1986 |
| JP | 62-79649 | 4/1987 |
| JP | 1-268131 | 10/1989 |
| JP | 02-248064 | 10/1990 |
| JP | 2-265258 | 10/1990 |
| JP | 4-042555 | 2/1992 |
| JP | 5-78629 | 3/1993 |
| JP | 7-263382 | 10/1995 |
| JP | 8-213349 | 8/1996 |
| JP | 10-335271 | 12/1998 |
| JP | 11-111162 | 4/1999 |
| JP | 2002-158276 | 5/2002 |
| JP | 2002-226800 A | 8/2002 |
| JP | 2003-119438 | 4/2003 |
| JP | 2003-206468 A | 7/2003 |
| JP | 2003-316031 A | 11/2003 |
| JP | 2003-56248 | 9/2004 |
| JP | 2004-349510 | 12/2004 |
| JP | 2007123914 A * | 5/2007 |

OTHER PUBLICATIONS

European Search Report issued on the related European Patent Application No. EP04012260, dated Jan. 4, 2005.
European Search Report issued on the related European Patent Application No. EP03023536, dated Jul. 27, 2004.
European Search Report issued on the related European Patent Application No. 03023536, dated Aug. 9, 2004.
European Search Report issued on the related European Patent Application No. 05 00 5884, dated Jun. 14, 2006.
File History of the related U.S. Appl. No. 10/849,414, as of Nov. 30, 2007.
File History of the related U.S. Appl. No. 11/082,112, as of Nov. 30, 2007.
File History of the related U.S. Appl. No. 11/671,982, as of Nov. 30, 2007.
File History of the related U.S. Appl. No. 11/947,727, as of Nov. 30, 2007.
File History of the related U.S. Appl. No. 29/225,424, as of Nov. 30, 2007.
Japanese Office Action issued on the related Japanese Patent Application No. 2003-431690, dated Jun. 26, 2007.
Japanese Patent Office Action issued on the related Japanese Patent Application No. 2003-431690, dated Jan. 18, 2007.
Notification of Reasons for Refusal issued on the related Japanese Patent Application No. 2003-152659, dated Sep. 27, 2006.
Written Opinion issued by the Austrian Patent Office on the related Singapore Patent Application No. 200402611-8, dated Apr. 13, 2007.
Chinese Office Action issued on the related Chinese Patent Application No. 200410098297.6, dated Sep. 28, 2007.
European Search Report issued on the related European Patent Application No. 05005884.1, dated Jun. 23, 2006.
File History of the related U.S. Appl. No. 10/849,414, for the period of Dec. 1, 2007-Aug. 19, 2008.
File History of the related U.S. Appl. No. 11/082,112, for the period of Dec. 1, 2007-Aug. 19, 2008.
File History of the related U.S. Appl. No. 11/671,982, for the period of Dec. 1, 2007-Aug. 19, 2008.
File History of the related U.S. Appl. No. 11/947,727, for the period of Dec. 1, 2007-Aug. 19, 2008.
File History of the related U.S. Appl. No. 29/225,424, for the period of Dec. 1, 2007-Aug. 19, 2008.
Japanese Office Action issued on the related Japanese Patent Application No. 2003-431690, dated Oct. 30, 2007.
File History of the related U.S. Appl. No. 11/671,982, for the period of Aug. 20, 2008-Mar. 23, 2009.
File History of the related U.S. Appl. No. 29/225,424, for the period of Aug. 20, 2008-Mar. 23, 2009.
File History of the related U.S. Appl. No. 12/370,049, as of Mar. 23, 2009.

* cited by examiner

DICING/DIE-BONDING FILM, METHOD OF FIXING CHIPPED WORK AND SEMICONDUCTOR DEVICE

CROSS-REFERENCE TO RELATED APPLICATIONS

This is a divisional application of U.S. patent application Ser. No. 10/678,855, field Oct. 3, 2003 now U.S. Pat. No. 7,060,339, which claims priority to Japanese Patent Application No. 2002-299930, filed Oct. 15, 2002, and the disclosure of which is herein incorporated by reference in its entirety.

BACKGROUND OF THE INVENTION

1. Field of the Invention

The present invention relates to a dicing/die-bonding film. The dicing/die-bonding film is used for subjecting a work to dicing in such a state that an adhesive for sticking a chipped work (semiconductor chip etc.) to an electrode material is arranged on a work (semiconductor wafer etc.) before dicing. Further, this invention relates to a method of fixing a chipped work by using the dicing/die-bonding film. Also, this invention relates to a semiconductor device having a chipped work adhesive-bonded by the fixing method.

2. Description of the Related Art

A semiconductor wafer on which a circuit pattern was formed is subjected to dice into chipped works (dicing step), as necessary after back-grinding to regulate the thickness. In the dicing step, the semiconductor wafer is generally washed at suitable fluid pressure (usually, about 2 kg/cm$^2$) to remove a cut layer. Then, the chipped work is adhesive-bonded onto an adherend such as a lead frame (mounting step), and then processed in a bonding step. In the mounting step, an adhesive is conventionally applied onto the lead frame or the chipped work. In this method, however, a uniform adhesive layer is hardly formed, and application of the adhesive requires a special unit and a long time. Accordingly, a dicing/die-bonding film having an adhesive layer adhering semiconductor wafer thereto in the dicing step and providing a chip-mounting necessary for the mounting step has been proposed (see e.g. in JP-A 60-57642).

The dicing/die-bonding film described in JP-A 60-57642 supra comprises an adhesive layer arranged in a releasable manner on a supporting base material. That is, a semiconductor wafer retained on an adhesive layer is diced, and the supporting base material is stretched to remove each chipped work together with the adhesive layer, and each work is recovered and fixed via the adhesive layer to an adherend such as a lead frame.

To prevent problems such as dicing inability and dimensional mistakes, the adhesive layer of this dicing/die-bonding film is desired to have an ability to sufficiently maintain the semiconductor wafer and an ability to sufficiently release the chipped work together with the adhesive layer from the supporting base material after dicing. However, it is not easy to balance both the abilities. When sufficient retention is required of the adhesive layer particularly in a system of dicing a semiconductor wafer with a rotating circular tooth, the dicing/die-bonding film satisfying the above characteristics is hardly obtained.

To overcome the problem, various improved methods are proposed (see e.g. on JP-A 2-248064). JP-A 2-248064 supra proposes a method which comprises allowing a UV-curing pressure-sensitive adhesive layer to be present between the supporting base material and the adhesive layer, then curing it by UV rays after dicing to lower the adhesion between the pressure-sensitive adhesive layer and the adhesive layer thereby releasing the layers from each other to facilitate pickup of the chipped work.

By this method, however, there are the cases where the adhesive layer achieving retention for the dicing step and releasability for a subsequent step in good balance is hardly formed. For example, when a large chipped work of 10 mm×10 mm or more is to be obtained, its area is so great that the chipped work cannot be easily picked up with a general die bonder.

SUMMARY OF THE INVENTION

An object of the present invention is to provide a dicing/die-bonding film comprising a pressure-sensitive adhesive layer on a supporting base material and a die-bonding adhesive layer arranged in a releasable manner on the pressure-sensitive adhesive layer, which is excellent in balance between retention in dicing a work and releasability in releasing its diced chipped work together with the die-bonding adhesive layer.

Another object of this invention is to provide a method of fixing a chipped work by using the dicing/die-bonding film. A still other object of this invention is to provide a semiconductor device comprising a chipped work adhesive-bonded by the fixing method.

The present inventors made extensive study to solve the problem, and as a result, they found a dicing/die-bonding film as following described, thus arriving at this invention.

That is, this invention relates to a dicing/die-bonding film comprising a pressure-sensitive adhesive layer (2) on a supporting base material (1) and a die-bonding adhesive layer (3) on the pressure-sensitive adhesive layer (2), wherein a releasability in an interface between the pressure-sensitive adhesive layer (2) and the die-bonding adhesive layer (3) is different between an interface (A) corresponding to a work-attaching region (3a) in the die-bonding adhesive layer (3) and an interface (B) corresponding to a part or a whole of the other region (3b), and the releasability of the interface (A) is higher than the releasability of the interface (B).

In the dicing/die-bonding film (1), the adhesion of the pressure-sensitive adhesive layer (2) to the die-bonding adhesive layer (3) is different between a region (2a) corresponding to the work-attaching region (3a) in the die-bonding adhesive layer (3) and a region (2b) corresponding to a part or the whole of the other region (3b), and satisfies the relationship the adhesion of the pressure-sensitive adhesive layer (2a) is lower than the adhesion of the pressure-sensitive adhesive layer (2b).

The dicing/die-bonding film (1) of this invention comprises a pressure-sensitive adhesive layer (2) on a supporting base material (1) and a die-bonding adhesive layer (3) in a releasable manner on the pressure-sensitive adhesive layer (2). In the pressure-sensitive adhesive layer (2), the adhesion of regions (2a, 2b) corresponding to the work-attaching region (3a) and the other region (3b) respectively in the die-bonding adhesive layer (3) is designed such that the adhesion of the pressure-sensitive adhesive layer (2a) is lower than the adhesion of the pressure-sensitive adhesive layer (2b). That is, the pressure-sensitive adhesive layer (2b) adheres suitably to the adhesive layer (3) during dicing step or expanding step, to prevent the adhesive layer (3) from being released from the pressure-sensitive adhesive layer (2). On the other hand, the pressure-sensitive adhesive layer (2a) can be easily released. Accordingly, a dicing/die-bonding film capable of easy release and pickup of a large chip of 10 mm×10 mm or more obtained as diced chipped work without inferior dicing can be obtained. Thus, the dicing/die-bonding film (1) according to this invention well balances retention during dicing step and releasability during pickup step.

In the dicing/die-bonding film (1), it is preferable that an adhesion of the work-attaching region (3a) in the die-bonding adhesive layer (3) to the work and to the pressure-sensitive adhesive layer (2a) satisfies the relationship:

the adhesion to the work is higher than the adhesion to the pressure-sensitive adhesive layer (2a).

When the adhesion of the die-bonding adhesive layer (3) to the work and to the pressure-sensitive adhesive layer (2a) satisfies this relationship, the die-bonding adhesive layer (3) arranged on the chipped work after dicing can be easily released from the pressure-sensitive adhesive layer (2a).

In the dicing/die-bonding film (1), the part of the region (3b) other than the work-attaching region (3a) in the die-bonding adhesive layer (3) can be used as a dicing ring-attaching region (3b'). In the dicing/die-bonding film (1), it is preferable that an adhesion of the dicing ring-attaching region (3b') in the die-bonding adhesive layer (3) to the dicing ring and to the pressure-sensitive adhesive layer (2b') satisfies the relationship:

the adhesion to the dicing ring is lower than the adhesion to the pressure-sensitive adhesive layer (2b').

When the adhesion of the die-bonding adhesive layer (3) satisfies the above relationship, the balance between retention during dicing step and releasability during pickup step is improved.

Further, this invention relates to a dicing/die-bonding film comprising a pressure-sensitive adhesive layer (2) on a supporting base material (1) and a die-bonding adhesive layer (3) on the pressure-sensitive adhesive layer (2), wherein the die-bonding adhesive layer (3) is arranged as a work-attaching region (3a) on a part of the pressure-sensitive adhesive layer (2), and a region (2a) corresponding to the work-attaching region (3a) in the pressure-sensitive adhesive layer (2) and the other region (2b) are different in adhesion and satisfy the relationship:

the adhesion of the pressure-sensitive adhesive layer (2a) is lower than the adhesion of the pressure-sensitive adhesive layer (2b).

The dicing/die-bonding film (2) of this invention comprises a pressure-sensitive adhesive layer (2) on a supporting base material (1) and a die-bonding adhesive layer (3) arranged as a work-attaching region (3a) in a releasable manner on a part of the pressure-sensitive adhesive layer (2). The pressure-sensitive adhesive layer (2) is designed such that the adhesion of the region (2a) corresponding to the work-attaching region (3a) and the adhesion of the other region (2b) satisfy the relationship: the adhesion of the pressure-sensitive adhesive layer (2a) is lower than the adhesion of the pressure-sensitive adhesive layer (2b). That is, the pressure-sensitive adhesive layer (2a) can be easily released. On the other hand, a wafer ring can be stuck on the pressure-sensitive adhesive layer (2b) and fixed such that it is not released during dicing step and expanding step. Accordingly, a dicing/die-bonding film capable of easy release and pickup of a large chip of 10 mm×10 mm or more obtained as diced chipped work without inferior dicing can be obtained. Thus, the dicing/die-bonding film (2) according to this invention well balances retention during dicing step and releasability during pickup step.

In the dicing/die bond (2), it is preferable that an adhesion of the work-attaching region (3a) to the work and to the pressure-sensitive adhesive layer (2a) satisfies the relationship:

the adhesion to the work is higher than the adhesion to the pressure-sensitive adhesive layer (2a).

When the adhesion of the die-bonding adhesive layer (3a) to the work and to the pressure-sensitive adhesive layer (2a) satisfies the above relationship, the die-bonding adhesive layer (3a) arranged on the chipped work after dicing can be easily released from the pressure-sensitive adhesive layer (2a).

In the dicing/die-bonding films (1) and (2), the pressure-sensitive adhesive layer (2) is formed preferably from a radiation-curing pressure-sensitive adhesive, and the pressure-sensitive adhesive layer (2a) corresponding to the work-attaching region (3a) can be formed by irradiation with radiations.

Further, this invention relates to a method of fixing a chipped work, comprising the steps of:

pressing a work onto a die-bonding adhesive layer (3a) in the dicing/die-bonding film (1) or (2), dicing the work into chips, releasing the chipped work together with the die-bonding adhesive layer (3a) from the pressure-sensitive adhesive layer (2a), and fixing the chipped work to a semiconductor element via the die-bonding adhesive layer (3a).

Further, this invention relates to a semiconductor device comprising a chipped work fixed onto a semiconductor element via the die-bonding adhesive (3a) by the method of fixing a chipped work to a substrate or a chip.

DETAILED DESCRIPTION OF THE PREFERRED EMBODIMENT

Figure 1:
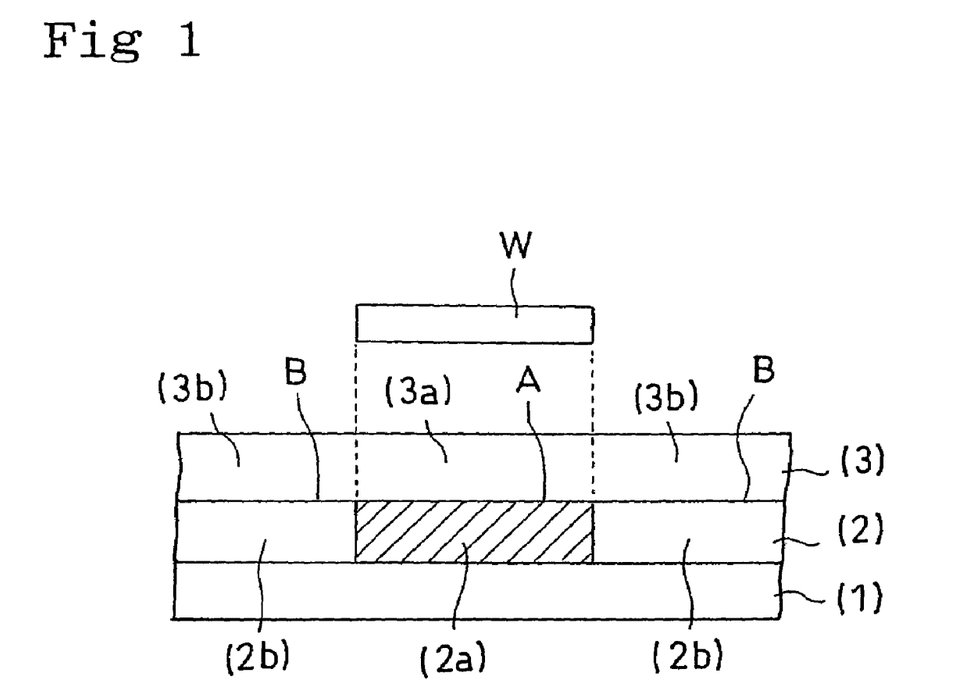
FIG. 1 is an example of a sectional view of the dicing/die-bonding film (1) of the present invention.
Figure 2:
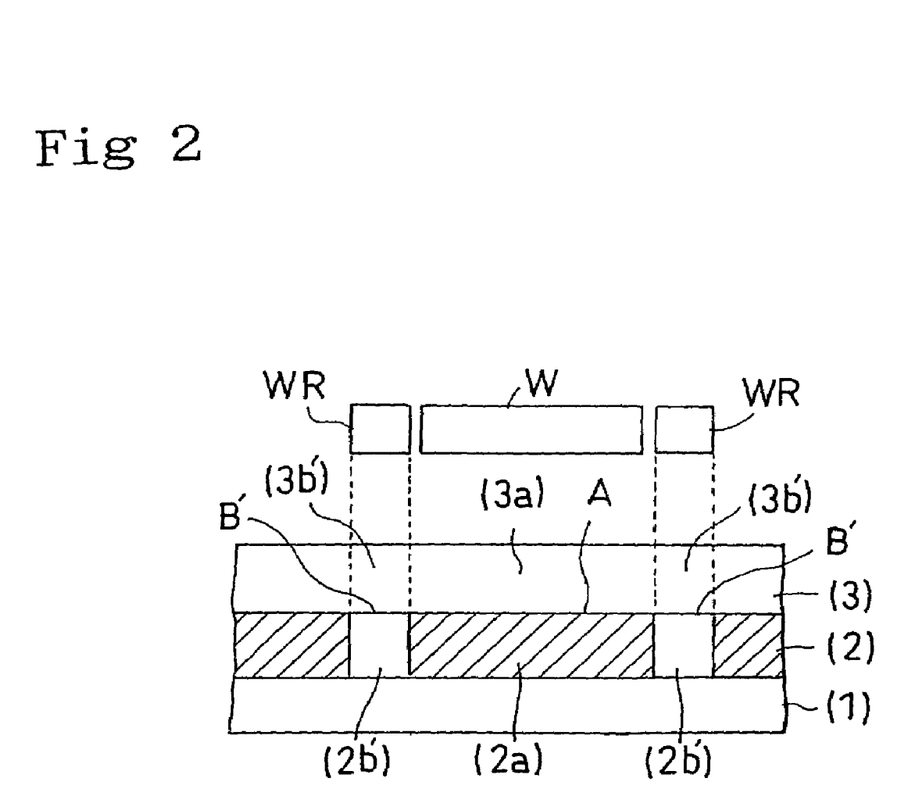
FIG. 2 is an example of a sectional view of the other dicing/die-bonding film (1) of the present invention.

Hereinafter, the dicing/die-bonding film of the present invention is described by reference to the drawings. FIGS. 1 and 2 are sectional views of the dicing/die-bonding film (1) of this invention that comprises a pressure-sensitive adhesive layer (2) on a supporting base material (1) and a die-bonding adhesive layer (3) on the pressure-sensitive adhesive layer (2).

In FIG. 1, the regions (2a, 2b) in the pressure-sensitive adhesive layer (2) are designed such that the releasability from the die-bonding adhesive layer (3) is in the relationship: the releasability of the interface (A) corresponding to the work-attaching region (3a) is higher than the releasability of the interface (B) corresponding to the other region (3b). The pressure-sensitive adhesive layer (2a) corresponds to the work-attaching region (3a) in the die-bonding adhesive layer (3), and the pressure-sensitive adhesive layer (2b) corresponds to the other region (3b).

FIG. 2 shows an example wherein the part of the region (3b) corresponds to the dicing ring-attaching region (3b'). That is, the releasability of the interface (B') between the dicing ring-attaching region (3b') and its corresponding pressure-sensitive adhesive layer (2b') is designed to be in the relationship: the releasability of the interface (A) is higher than the releasability of the interface (B'). In FIG. 1, the whole of the pressure-sensitive adhesive layer (2) except for the pressure-sensitive adhesive layer (2a) is the pressure-sensitive adhesive layer (2*b*), but as shown in FIG. 2, the part of the pressure-sensitive adhesive layer (2) except for the pressure-sensitive adhesive layer (2*a*) can also be the pressure-sensitive adhesive layer (2*b*).

Figure 3:
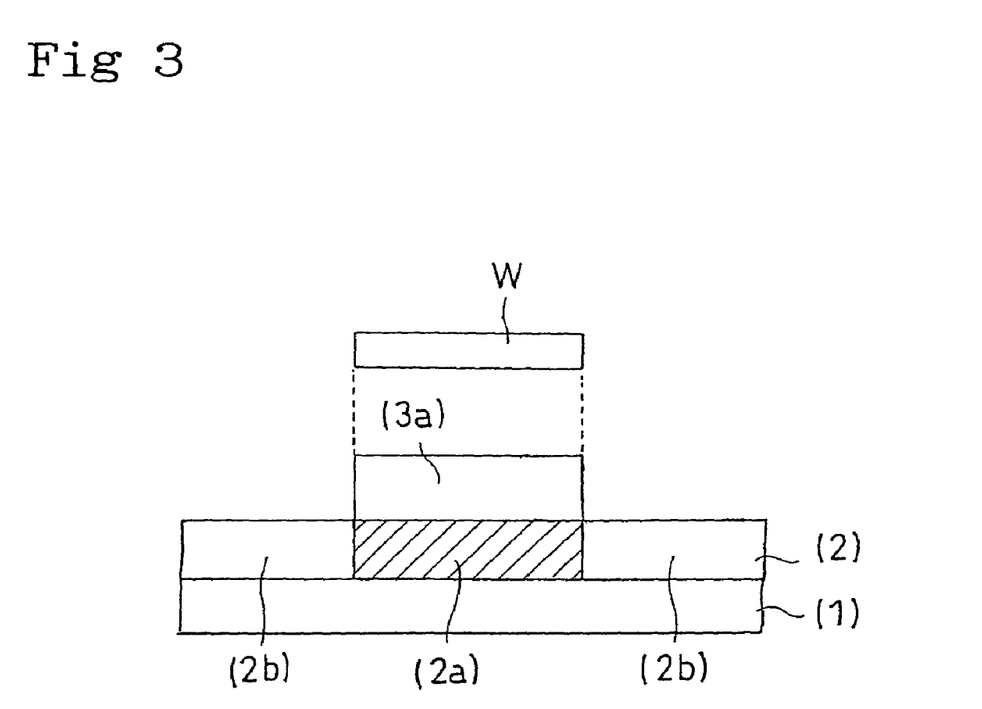
FIG. 3 is an example of a sectional view of the dicing/die-bonding film (2) of the present invention.

FIG. 3 shows a sectional view of the dicing/die-bonding film (2) of this invention that comprises a pressure-sensitive adhesive layer (2) on a supporting base material (1) and a work-attaching region (3*a*) on a part of the pressure-sensitive adhesive layer (2). The respective regions (2*a*, 2*b*) are designed such that the adhesion of the region (2*a*) corresponding to the work-attaching region (3*a*) and the adhesion of the other region (2*b*) in the pressure-sensitive adhesive layer (2) is in the relationship: the adhesion of the pressure-sensitive adhesive layer (2*a*) is lower than the adhesion of the pressure-sensitive adhesive layer (2*b*).

The supporting base material (1) serves as a material conferring strength on the dicing/die-bonding film. Examples thereof include polyolefins such as low-density polyethylene, linear polyethylene, medium-density polyethylene, high-density polyethylene, super-low-density polyethylene, a random copolymer of polypropylene, a block copolymer of polypropylene, homopolypropylene, polybutene and polymethyl pentene; an ethylene-vinyl acetate copolymer, ionomer resin, an ethylene/(meth)acrylic acid copolymer, an ethylene/(meth)acrylate (random, alternating) copolymer, an ethylene-butene copolymer, an ethylene-hexene copolymer, polyurethane, polyesters such as polyethylene terephthalate and polyethylene naphthalene, polycarbonate, polyimide, polyether ether ketone, polyimide, polyether imide, polyamide, aromatic polyamide, polyphenyl sulfide, aramid (paper), glass, glass cloth, fluorine resin, polyvinyl chloride, polyvinylidene chloride, cellulose resin, silicone resin, metal (foil), paper etc.

The material of the supporting base material includes polymers such as crosslinked resin. The plastic film may be non-stretched or may be subjected to uniaxial or biaxial stretching treatment if necessary. The resin sheet endowed with thermal shrinkage by stretching treatment can thermally shrink the supporting base material after dicing, whereby the contact area between the pressure-sensitive adhesive layer (2*a*) and the adhesive layer (3*a*) is reduced to facilitate recovery of the chipped work.

The surface of the supporting base material can be subjected to ordinary surface treatment for improving adhesion and maintenance of the adjacent layer, for example chemical or physical treatment such as treatment with chromate, exposure to ozone, exposure to flames, high-voltage electric shock exposure, and treatment with ionization radiations, or coating treatment with a undercoat (for example, a sticky material described later).

The material of the supporting base material may be the same material or a suitable mixture of different materials, and if necessary a blend of several materials can also be used. Further, the supporting base material may be provided thereon with an electroconductive deposit of 30 to 500 Å in thickness composed of a metal, an alloy or oxide thereof in order to confer antistatic performance. The supporting base material may be composed of a single or two or more layers. When the pressure-sensitive adhesive layer (2) is radiation-curing type, a supporting base material partially transmitting radiations such as X rays, UV rays and electron rays is used.

The thickness of the supporting base material (1) can be suitably determined without particular limitation, but is generally about 5 to 200 µm.

The pressure-sensitive adhesive used in formation of the pressure-sensitive adhesive layer (2) is not particularly limited, but is preferably a radiation-curing pressure-sensitive adhesive easily providing a difference in adhesion between the pressure-sensitive adhesive layers (2*a*) and (2*b*). The radiation-curing pressure-sensitive adhesive can easily lower the adhesion by increasing the degree of crosslinking upon irradiation with radiations such as UV rays. Accordingly, the radiation-curing pressure-sensitive adhesive layer fitted with the work-attaching region (3*a*) can be cured to easily provide the pressure-sensitive adhesive layer (2*a*) with a significant reduction in adhesion. Because the adhesive layer (3) or (3*a*) is stuck on the. pressure-sensitive adhesive layer (2*a*) whose adhesion was reduced, the interface between the pressure-sensitive adhesive layer (2*a*) and the adhesive layer (3*a*) is inherently easily separated at the pickup step. On the other hand, the region not irradiated with radiations has sufficient adhesion, and forms the pressure-sensitive adhesive layer (2*b*).

In the dicing/die-bonding film (1), the pressure-sensitive adhesive layer (2*b*) made of the uncured radiation-curing pressure-sensitive adhesive adheres to the adhesive layer (3), thus maintaining retaining force at the dicing step. Thus, the radiation-curing pressure-sensitive adhesive can, with good balance between adhesion and release, support the die-bonding adhesive layer (3) for fixing a chipped work (semiconductor chip etc.) to an adherend (referred to as semiconductor element) such as a substrate and a chipped work. In the dicing/die-bonding film (2), the pressure-sensitive adhesive layer (2*b*) can fix a wafer ring etc.

The radiation-curing pressure-sensitive adhesive used in formation of the pressure-sensitive adhesive layer (2) can be used without particular limitation insofar as it has radiation-curing functional groups such as carbon-carbon double bonds and simultaneously shows adhesion.

Examples of the radiation-curing pressure-sensitive adhesive include addition-type radiation-curing pressure-sensitive adhesives comprising a radiation-curing monomer component or oligomer component compounded with a general pressure-sensitive adhesive for example the above-mentioned acrylic pressure-sensitive adhesive or rubber pressure-sensitive adhesive. From the viewpoint of cleaning and detergency for pollutant-free electronic parts such as semiconductor wafers and glass with ultra-pure water or an organic solvent such as alcohol, the pressure-sensitive adhesive is preferably an acrylic pressure-sensitive adhesive based on an acrylic polymer.

The acrylic polymer is, for example, an acrylic polymer using one or more monomer components selected from alkyl (meth)acrylates (for example, $C_{1-30}$ alkyl, particularly $C_{4-18}$ linear or branched alkyl esters such as methyl ester, ethyl ester, propyl ester, isopropyl ester, butyl ester, isobutyl ester, s-butyl ester, t-butyl ester, pentyl ester, isopentyl ester, hexyl ester, heptyl ester, octyl ester, 2-ethyl hexyl ester, isooctyl ester, nonyl ester, decyl ester, isodecyl ester, undecyl ester, dodecyl ester, tridecyl ester, tetradecyl ester, hexadecyl ester, octadecyl ester, eicosyl ester etc.) and cycloalkyl (meth)acrylates (for example, cyclopentyl ester, cyclohexyl ester etc.). The (meth)acrylates refer to acrylates and/or methacrylates, and in this meaning, (meth) is used throughout in this invention.

For the purpose of improving cohesiveness and heat resistance, the acrylic polymer may contain units corresponding to other monomer components copolymerizable with the above (meth)acrylates and cycloalkyl esters. Such monomer components include, for example, carboxyl group-containing monomers such as acrylic acid, methacrylic acid, carboxyethyl (meth)acrylate, carboxypentyl (meth)acrylate, itaconic acid, maleic acid, fumaric acid and crotonic acid; acid anhydride monomers such as maleic anhydride and itaconic anhydride; hydroxyl group-containing monomers such as 2-hydroxyethyl (meth)acrylate, 2-hydroxypropyl (meth)acrylate, 4-hydroxybutyl (meth)acrylate, 6-hydroxyhexyl (meth)acrylate, 8-hydroxyoctyl (meth)acrylate, 10-hydroxydecyl (meth)acrylate, 12-hydroxylauryl (meth)acrylate and (4-hydroxymethylcyclohexyl)methyl (meth)acrylate; sulfonic acid group-containing monomers such as styrenesulfonic acid, allylsulfonic acid, 2-(meth)acrylamide-2-methylpropanesulfonic acid, (meth)acrylamidopropanesulfonic acid and sulfopropyl (meth)acrylate, (meth)acryloyloxy naphthalene sulfonic acid; phosphate group-containing monomers such as 2-hydroxyethylacryloyl phosphate; and acrylamide, acrylonitrile etc. One or more of these copolymerizable monomer components can be used. The amount of these copolymerizable monomers is preferably 40% or less by weight based on the total monomer components.

If necessary, the acrylic polymers can contain multifunctional monomers to be crosslinked as copolymerizable monomer components. The multifunctional monomers include, for example, hexanediol di(meth)acrylate, (poly)ethylene glycol di(meth)acrylate, (poly)propylene glycol di(meth)acrylate, neopentyl glycol di(meth)acrylate, pentaerythritol di(meth) acrylate, trimethylol propane tri(meth)acrylate, pentaerythritol tri(meth)acrylate, dipentaerythritol hexa(meth)acrylate, epoxy (meth)acrylate, polyester (meth)acrylate, urethane (meth)acrylate etc. One or more of these multifunctional monomers can be used. From the viewpoint of adhesion properties etc., the amount of the multifunctional monomers is preferably 30% or less by weight based on the total monomer components.

The acrylic polymer is obtained by subjecting a single monomer or a mixture of two or more monomers to polymerization. This polymerization can be carried out in any systems of solution polymerization, emulsion polymerization, bulk polymerization and suspension polymerization. From the viewpoint of preventing pollution of a clean adherend, the content of low-molecular substances in the acrylic polymer is preferably lower. In this respect, the number-average molecular weight of the acrylic polymer is preferably 300,000 or more, more preferably about 400,000 to 3,000,000.

The pressure-sensitive adhesive can suitably use an external crosslinking agent for increasing the number-average molecular weight of the acrylic polymer etc. as the base polymer. A specific means of an external crosslinking method includes a method of reacting monomers by adding a crosslinking agent such as polyisocyanate compound, epoxy compound and aziridine compound, melamine-based crosslinking agent. When the external crosslinking agent is used, the amount of the crosslinking agent used is suitably determined according to balancing with the base polymer to be crosslinked and the use of the pressure-sensitive adhesive. Generally, the external crosslinking agent is compounded in an amount of preferably 5 parts or less by weight, more preferably 0.1 to 5 parts by weight, based on 100 parts by weight of the base polymer. If necessary, the pressure-sensitive adhesive may include various kinds of conventional additives such as tackifier, antioxidants etc.

The radiation-curing monomer components blended include, for example, urethane oligomers, urethane (meth) acrylate, trimethylol propane tri(meth)acrylate, tetramethylol methane tetra(meth)acrylate, pentaerythritol tri(meth)acrylate, pentaerythritol tetra(meth)acrylate, dipentaerythritol monohydroxypenta(meth)acrylate, dipentaerythritol hexa(meth)acrylate, 1,4-butanediol di(meth)acrylate etc. The radiation-curing oligomer components include various oligomers such as those based on urethane, polyether, polyester, polycarbonate and polybutene, and the molecular weight thereof is preferably in the range of about 100 to 30000. Depending on the type of the pressure-sensitive adhesive layer, the amount of the radiation-curing monomer components and oligomer components blended can be suitably determined so as to lower the adhesion of the pressure-sensitive adhesive layer. Generally, the amount thereof is for example 5 to 500 parts by weight, preferably 40 to 150 parts by weight, based on 100 parts by weight of the base polymer such as the acrylic polymer constituting the pressure-sensitive adhesive.

The radiation-curing pressure-sensitive adhesive includes not only the above-described addition-type radiation curing pressure-sensitive adhesives, but also internal-type radiation-curing pressure-sensitive adhesives using a base polymer having carbon-carbon double bonds in side chains or main chain of the polymer or at the end of the main chain. The internal-type radiation-curing pressure-sensitive adhesive is preferable because it does not requires incorporation of low-molecular components such as oligomer components or does not contain a large amount of oligomer components, thus enabling formation of a pressure-sensitive adhesive layer having a stable layer structure without movement with time of the oligomer components etc. in the pressure-sensitive adhesive.

The base polymer having carbon-carbon double bonds can be used without particular limitation insofar as it has carbon-carbon double bonds and simultaneously has adhesion. The base polymer preferably has an acrylic polymer as a fundamental skeleton. As the fundamental skeleton of the acrylic polymer, mention is made of the above-exemplified acrylic polymer.

The method of introducing carbon-carbon double bonds into the acrylic polymer is not particularly limited and various methods can be used, but it is easy in molecular design to introduce carbon-carbon double bonds into side chains of the polymer. For example, mention is made of a method in which a monomer having a functional group is copolymerized with the acrylic polymer, and then a compound having carbon-carbon double bonds and a functional group capable of reacting with the above functional group is subjected, while the radiation curing properties of the carbon-carbon double bonds are maintained, to condensation or addition reaction with the copolymer.

Combinations of these functional groups include, for example, a carboxylic acid group and an epoxy group, a carboxylic acid group and an aziridyl group, and a hydroxyl group and an isocyanate group. Among those combinations of functional groups, a combination of a hydroxyl group and an isocyanate group is preferable for easy monitoring of the reaction. Further, if a combination of such functional groups is a combination forming the acrylic polymer having carbon-carbon double bonds, the functional groups may be present in either the acrylic polymer or the above compound, and it is preferable in the above preferable combination that the acrylic polymer has a hydroxyl group, and the above compound has an isocyanate group. In this case, the isocyanate compound having carbon-carbon double bonds includes, for example, methacryloyl isocyanate, 2-methacryloyl oxyethyl isocyanate, m-isopropenyl-α,α-dimethylbenzyl isocyanate etc. As the acrylic polymer, use is made of a polymer prepared by copolymerizing the above-exemplified hydroxyl group-containing monomer or an ether compound such as 2-hydroxy ethyl vinyl ether, 4-hydroxy butyl vinyl ether or diethylene glycol monovinyl ether.

As the internal-type radiation-curing pressure-sensitive adhesive, the base polymer having carbon-carbon double bonds (particularly the acrylic polymer) can be singly used.

The radiation-curing monomer components and oligomer components can also be compounded to such a degree that the characteristics are not deteriorated. The amount of the radiation-curing oligomer components is usually in the range of 0 to 30 parts by weight, preferably 0 to 10 parts by weight, based on 100 parts by weight of the base polymer.

For curing with UV rays etc., the radiation-curing pressure-sensitive adhesive is blended with a photopolymerization initiator. The photopolymerization initiator includes, for example, α-ketol compounds such as 4-(2-hydroxyethoxy) phenyl(2-hydroxy-2-propyl)ketone, α-hydroxy-α,α'-dimethyl acetophenone, 2-methyl-2-hydroxypropiophenone and 1-hydroxycyclohexyl phenyl ketone; acetophenone compounds such as methoxy acetophenone, 2,2-dimethoxy-2-phenyl acetophenone, 2,2-diethoxy acetophenone and 2-methyl-1-[4-(methylthio)-phenyl]-2-morpholinopropane-1; benzoin ether compounds such as benzoin ethyl ether, benzoin isopropyl ether and anisoin methyl ether; ketal compounds such as benzyl dimethyl ketal; aromatic sulfonyl chloride compounds such as 2-naphthalene sulfonyl chloride; optically active oxime compounds such as 1-phenone-1,1-propanedione-2-(o-ethoxycarbonyl)oxime; benzophenone compounds such as benzophenone, benzoylbenzoic acid and 3,3'-dimethyl-4-methoxy benzophenone; thioxanthone compounds such as thioxanthone, 2-chlorothioxanthone, 2-methyl thioxanthone, 2,4-dimethyl thioxanthone, isopropyl thioxanthone, 2,4-dichlorothioxanthone, 2,4-diethyl thioxanthone and 2,4-diisopropyl thioxanthone; camphor quinone; halogenated ketones; acyl phosphinoxides; and acyl phosphonates. The amount of the photopolymerization initiator blended is for example 0.05 to 20 parts by weight based on 100 parts by weight of the base polymer such as acrylic polymer constituting the pressure-sensitive adhesive.

The radiation-curing pressure-sensitive adhesive include pressure-sensitive adhesive disclosed in JP-A 60-196956, for example rubber-based pressure-sensitive adhesive and acrylic pressure-sensitive adhesive containing an addition-polymerizable compound having two or more unsaturated bonds or a photopolymerizable compound such as alkoxy silane having an epoxy group and a photopolymerizable initiator such as a carbonyl compound, organic sulfur compound, peroxide, amine, or onium salt-based compound.

If necessary, the radiation-curing pressure-sensitive adhesive layer (2) can also contain a compound to be colored by irradiation with radiations. By incorporating the compound colored by irradiation with radiations into the radiation-curing pressure-sensitive adhesive (2), only a region irradiated with radiations can be colored. That is, the pressure-sensitive adhesive layer (2a) corresponding to the work-attaching region (3a) can be colored. Accordingly, whether the pressure-sensitive adhesive layer (2) has been irradiated with radiations can be immediately judged with the naked eye, and the work-attaching region (3a) can be easily recognized to facilitate attachment to a work. Further, when the resulting semiconductor element is detected by an optical sensor etc., the detection accuracy is improved, thus preventing erroneous working in pickup of the semiconductor element.

The compounds to be colored by irradiation with radiations are colorless or light-colored before irradiation with radiations, but are colored by irradiation with radiations. Preferable examples of such compounds include leuco dyes. The leuco dyes used are preferably conventional dyes based on triphenyl methane, fluoran, phenothiazine, auramine and spiropyran. Specifically, mention is made of 3-[N-(p-tolylamino)]-7-anilinofluoran, 3-[N-(p-tolyl)-N-methylamino]-7-anilinofluoran, 3-[N-(p-tolyl)-N-ethylamino]-7-anilinofluoran, 3-diethylamino-6-methyl-7-anilinofluoran, crystal violet lactone, 4,4',4"-trisdimethylaminotriphenyl methanol, and 4,4',4"-trisdimethylaminotriphenyl methane, etc.

Developers used preferably with these leuco dyes include electron acceptors, for example conventionally used initial polymers of phenol-formalin resin, aromatic carboxylic acid derivatives, activated clay etc., and can be used in combination with various coloring agents for changing color tone.

The compound to be colored with irradiation with radiations may be first dissolved in an organic solvent etc. and then incorporated into the radiation-curing pressure-sensitive adhesive, or may be first pulverized finely and then incorporated into the pressure-sensitive adhesive. The ratio of this compound used is 10% or less by weight, preferably 0.01 to 10% by weight, more preferably 0.5 to 5% by weight, based on the pressure-sensitive adhesive layer (2). When the ratio of the compound is higher than 10% by weight, too much radiation applied to the pressure-sensitive adhesive layer (2) is adsorbed into this compound, and therefore the pressure-sensitive adhesive layer (2a) is hardly cured, thus failing to lower adhesion sufficiently. For sufficient coloration, on the other hand, the ratio of the compound is preferably 0.01% or more by weight.

The pressure-sensitive adhesive layer (2) is arranged such that the adhesion of the pressure-sensitive adhesive layer (2a) is lower than the adhesion of the pressure-sensitive adhesive layer (2b). In the dicing/die-bonding film (1), the adhesion to the die-bonding adhesive layer (3) is determined such that the releasability of the interface (A) is higher than the releasability of the interface (B). In the dicing/die-bonding film (2), the adhesion of the pressure-sensitive adhesive layer (2a) to an SUS304 plate (#2000 polishing) as an adherend is lower than the adhesion of the pressure-sensitive adhesive layer (2b) to the plate.

In the case where the pressure-sensitive adhesive layer (2) is formed from a radiation-curing pressure-sensitive adhesive, mention is made of a method wherein the radiation-curing pressure-sensitive adhesive layer (2) is formed on the supporting base material (1), a region corresponding to the work-attaching region (3a) is cured by partial irradiation with radiations, to form the pressure-sensitive adhesive layer (2a). The partial irradiation with radiations can be carried out via a photomask having a pattern corresponding to the region (3b) etc.) other than the work-attaching region (3a). Mention is also made of a method of curing the pressure-sensitive adhesive layer by spot irradiation with UV rays. Formation of the radiation-curing pressure-sensitive adhesive layer (2) can be carried out by transferring the layer arranged on a separator to the supporting base material (1). The radiation-curing pressure-sensitive adhesive layer (2) arranged on the separator may be subjected to partial curing with radiations.

Alternatively, when the pressure-sensitive adhesive layer (2) is formed from a radiation-curing pressure-sensitive adhesive, use can be made of a method wherein the supporting base material (1), at least one side of which is light-shielded except for the whole or a part of a region corresponding to the work-attaching region (3a), is provided with the radiation-curing pressure-sensitive adhesive layer (2) and then cured in the region corresponding to the work-attaching region (3a) to form the pressure-sensitive adhesive layer (2a) whose adhesion is lowered. Printing or depositing a material capable of serving as a photomask on the supporting film can produce the light-shielding material. According to such production method, the dicing/die-bonding film of this invention can be efficiently produced.

When curing inhibition by oxygen occurs during irradiation with radiations, the surface of the radiation-curing pressure-sensitive adhesive layer (2) is preferably shielded from oxygen (air) by some methods. Such methods involve covering the surface of the pressure-sensitive adhesive layer (2) with a separator or irradiating with radiations such as UV rays etc. in a nitrogen atmosphere.

The thickness of the pressure-sensitive adhesive layer (2) is not particularly limited, but is preferably about 1 to 50 μm from the viewpoint of preventing the cut surface of a chip from being broken and simultaneously retaining the adhesive layer. The thickness is more preferably 2 to 30 μm, still more preferably 5 to 25 μm.

When a work (semiconductor wafer etc.) contact-bonded onto the die-bonding adhesive layer (3) is diced into chips, the adhesive layer (3) adheres to and supports the work, and when the chipped work formed into cut fragment (semiconductor chip etc.) is to be mounted, the adhesive layer works for fixing the chipped work to a semiconductor element (substrate, chip etc.). It is particularly important that the die-bonding adhesive layer (3) has such adhesion as not to scatter cut fragments during dicing of the work. In the dicing/die-bonding film (2), the die-bonding adhesive layer (3) is arranged in the previously formed work-attaching region (3a).

The die-bonding adhesive layer (3) can be formed from a usual die adhesive. The die adhesive is preferably an adhesive that can be formed into a sheet. Preferable examples of the die adhesive include die adhesives made of thermoplastic or thermosetting resins. The die adhesives can be used alone or more in combination thereof. The die-bonding adhesive layer is preferably a layer that can stick to a work such as a semiconductor wafer or to a dicing ring at 70° C. or less. The die-bonding adhesive layer is more preferably a layer that can stick at ordinary temperatures.

The thermoplastic resin used as the die adhesive (thermoplastic die adhesive) includes, for example, saturated polyester resin, thermoplastic polyurethane-based resin, amide-based resin (nylon-based resin), imide-based resin etc. The thermosetting resin (thermosetting die adhesive) includes, for example, epoxy resin, unsaturated polyester-based resin, thermosetting acrylic resin, phenol resin etc. The thermosetting resin is preferably a thermosetting resin in B-stage, which was desolvated and formed into a sheet. A mixture in B-stage of the thermosetting resin and thermoplastic resin can also be used. In this invention, resins for examples those having a high glass transition temperature based on silicone, rubber, urethane, imide and acryl can also be used as the die adhesive.

The die-bonding adhesive layer (3) may have a two- or more multi-layer structure by suitably combining thermoplastic resins different in glass transition temperature or thermosetting resins different in thermosetting temperature. Because water for cutting is used in the step of dicing the work (semiconductor wafer etc.), the die-bonding adhesive layer (3) adsorbs moisture to attain a water content higher than in an ordinary state. When the adhesive layer (3) having such a high water content is allowed to adhere to a substrate etc., water vapor may be retained in the interface of the adhesive at the after-cure stage to cause lifting. Accordingly, the die-bonding adhesive is constituted such that a film highly adsorbing moisture is sandwiched between the die adhesives, whereby water vapor is diffused through the film at the after-cure stage, to overcome the problem. Accordingly, the die-bonding adhesive layer (3) may be composed of a multi-layer structure having an adhesive layer, a film and an adhesive layer laminated in this order.

Though not particularly limited, the thickness of the die-bonding adhesive layer (3) is for example about 5 to 100 μm, preferably about 10 to 50 μm.

The dicing/die-bonding films (1) and (2) comprising the pressure-sensitive adhesive layer (2) on the supporting base material (1) and the die-bonding adhesive layer (3) on the pressure-sensitive adhesive layer (2) are obtained in this manner.

The dicing/die-bonding films (1) and (2) can be endowed with antistatic performance for the purpose of preventing generation of static electricity upon sticking or release, or breakage of circuits by works (semiconductor wafer etc.) electrified with such static electricity. Antistatic performance can be given in a suitable system, for example by adding an antistatic agent or an electroconductive material to the supporting base material (1), the pressure-sensitive adhesive layer (2) or the adhesive layer (3) or by providing the supporting base material (1) with an electrostatic layer made of a charge-transferring complex or a metallic film. This system is preferably a system not generating contaminating ions that may denature semiconductor wafers. The electroconductive material (electroconductive filers) incorporated for the purpose of conferring electrical conductivity, thermal conductivity etc. includes spherical, needle or flaky metal powders of silver, aluminum, gold, copper, nickel, electroconductive alloys etc., metal oxides such as alumina, amorphous carbon black, graphite etc.

In the dicing/die-bonding film (1), the adhesion of the pressure-sensitive adhesive layer (2) to the die-bonding adhesive layer (3) is designed such that the adhesion of the pressure-sensitive adhesive layer (2a) is lower than the adhesion of the pressure-sensitive adhesive layer (2b). On the basis of the adhesion (90° peel value, peel rate 300 mm/min.) at ordinary temperature (23° C.), the adhesion of the pressure-sensitive adhesive layer (2a) is preferably not higher than 0.5 N/20 mm, more preferably 0.01 to 0.42 N/20 mm, still more preferably 0.01 to 0.35 N/20 mm from the viewpoint of retention of a wafer or recovery of formed chips. On the other hand, the adhesion of the pressure-sensitive adhesive layer (2b) is preferably about 0.5 to 20 N/20 mm. Even if the pressure-sensitive adhesive layer (2a) has low peel adhesion, the adhesion of the pressure-sensitive adhesive layer (2b) can prevent chips from being scattered, and can demonstrate sufficient retention for processing of wafers.

In the dicing/die-bonding film (2), the region (2a) corresponding to the work-attaching region (3a) and the other region (2b) in the pressure-sensitive adhesive layer (2) are designed such that the adhesion of the pressure-sensitive adhesive layer (2a) is lower than the adhesion of the pressure-sensitive adhesive layer (2b). The adhesion of the pressure-sensitive adhesive layer (2a) to the work-attaching region (3a) (under the same conditions as described above) is not higher than 0.5 N/20 mm, more preferably 0.01 to 0.42 N/20 mm, and still more preferably 0.01 to 0.35 N/20 mm.

In the dicing/die-bonding films (1) and (2), the adhesion of the work-attaching region (3a) to the work and to the pressure-sensitive adhesive layer (2a) is desired preferably such that the adhesion to the work is higher than the adhesion to the pressure-sensitive adhesive layer (2a). The adhesion to the work is regulated suitably depending on the type of the work.

As described above, the adhesion of the work-attaching region (3a) to the pressure-sensitive adhesive layer (2a) (under the same conditions as described above) is not higher than 0.5 N/20 mm, more preferably 0.01 to 0.42 N/20 mm, and still more preferably 0.01 to 0.35 N/20 mm. On the other hand, the adhesion of the work-attaching region (3a) to the work (under the same conditions as described above) is not higher than 10 to 50 N/20 mm, more preferably 10 to 30 N/20 mm, from the viewpoint of pickup and reliability at the time of dicing, pickup, and die-bonding.

When the region (3b) other than the work-attaching region (3a) is used as the dicing ring-attaching region (3b') in the dicing/die-bonding film (1), the adhesion of the dicing ring-attaching region (3b') in the die-bonding adhesive layer (3) to the work and to the pressure-sensitive adhesive layer (2b') is designed preferably such that the adhesion to the dicing ring is lower than the adhesion to the pressure-sensitive adhesive layer (2b'). The adhesion to the dicing ring is regulated suitably depending on the type of the dicing ring.

As described above, the adhesion of the die-bonding adhesive layer (3) to the pressure-sensitive adhesive layer (2b') (under the same conditions as described above) is preferably about 0.5 to 20 N/20 mm. On the other hand, the adhesion of the die-bonding adhesive layer (3) to the dicing ring is preferably 0.3 to 5 N/20 mm, more preferably 0.5 to 5 N/20 mm, from the view point of workability at the time of dicing and die-bonding.

In the dicing/die-bonding films (1) and (2), the die-bonding adhesive layers (3) and (3a) may be protected with a separator (not shown in drawings). That is, a separator may be arbitrarily arranged. The separator functions as a protecting material protecting the die-bonding adhesive layers (3) and (3a). Further, the separator can also be used as a supporting base material for transferring the die-bonding adhesives (3) and (3a) to the pressure-sensitive adhesive layer (2). The separator is removed just before a work is stuck on the die-bonding adhesive layer (3) or (3a) in the dicing/die-bonding film (1) or (2). The separator includes a polyethylene or polypropylene film or a plastic film and paper coated with a releasing agent such as fluorine releasing agent or a long chain alkyl acrylate releasing agent.

After the separator arranged arbitrarily on the adhesive layer (3) or (3a) is removed, the dicing/die-bonding film (1) or (2) of this invention is used in the following manner. That is, a work is pressed to the die-bonding adhesive layer (3a) in the dicing/die-bonding film (1) or (2), and the work is adhesive-bonded to the adhesive layer (3a). This pressing is carried out in a usual manner. The work used in this invention is preferably a semiconductor wafer. Then, the work is diced into chips. The work includes, for example, a semiconductor wafer, a multi-layer substrate, a simultaneously sealed module etc. The work used in this invention is preferably a semiconductor wafer. By dicing, the work having the adhesive layer (3) is formed into chipped works (semiconductor chips etc.) by suitable means using a rotating circular tooth.

Then, the chipped work together with the die-bonding adhesive layer (3a) is released from the pressure-sensitive adhesive layer (2a). The chipped work thus picked up is adhesive-bonded via the die-bonding adhesive layer (3a) to a semiconductor element as an adherend. The semiconductor element includes a lead frame, a TAB film, a substrate or a separately prepared chipped work. For example, the adherend may be a deformed adherend to be easily deformed, or a hardly deformable non-deformed adherent (semiconductor wafer etc.). The adherend is preferably a semiconductor wafer. When the adhesive layer (3) or (3a) is thermosetting, the work is adhesive-bonded to an adherend by thermosetting, to improve heat resistance. For example, the chipped work adhesive-bonded to a substrate via the adhesive layers (3a) can be subjected to a reflow process.

EXAMPLES

Hereinafter, this invention is described in more detail by reference to the Examples. In the following description, "parts" refers to parts by weight. For irradiation with ultraviolet rays, an ultraviolet (UV) irradiation unit (NEL UM-110 (Nitto Seiki Co., Ltd.) was used.

Production Example

Preparation of a Die-Bonding Adhesive Layer

The components shown in Table 1 below, that is, epoxy resin, phenol resin, acrylic rubber, silica and a curing accelerator were compounded in the ratios shown in the table to prepare compositions for die-bonding adhesives (A) to (C), and each composition was mixed with and dissolved in toluene. The mixed solution was applied onto a polyester film (separator) treated with a releasing agent. Then, the polyester film coated with the mixed solution was dried at 120° C. to remove the toluene, whereby each of the die-bonding adhesive layers A to C of 20 μm in thickness in the B-stage on the polyester film were obtained.

TABLE 1

| Compositions | Die-bonding adhesive (parts by weight) | | |
|---|---|---|---|
| | A | B | C |
| Epoxy resin (a1) | 24.9 | 24.9 | 15.5 |
| Epoxy resin (a2) | 24.9 | 24.9 | 15.5 |
| Phenol resin | 29.2 | 29.2 | 18 |
| Acrylic rubber | 20 | 20 | 50 |
| Silica | 0 | 100 | 100 |
| Curing accelerator | 1 | 1 | 1 |

In Table 1,
<Epoxy resin (a1)> is bisphenol A type epoxy resin (epoxy equivalent, 186 g/eq.; viscosity, 10 Pa·s/25° C.),
<Epoxy resin (a2)> is triphenol methane type epoxy resin (epoxy equivalent, 170 g/eq.; softening point, 80° C.; viscosity, 0.08 Pa·s/150° C.),
<Phenol resin> is novolak type phenol resin (hydroxyl group equivalent, 104 g/eq.; softening point, 80° C.; viscosity, 0.1 Pa·s/150° C.),
<Acrylic rubber> (Mooney viscosity: 50),
<Spherical silica> Average particle diameter, 1 μm; maximum particle diameter, 10 μm, and
<Curing accelerator> is triphenylphosphine.

Example 1

(Preparation of a Radiation-Curing Acrylic Pressure-Sensitive Adhesive)

70 parts of butyl acrylate, 30 parts of ethyl acrylate and 5 parts of acrylic acid were copolymerized in ethyl acetate in a usual manner to give a solution containing an acrylic polymer at a concentration of 30% by weight having a weight-average molecular weight of 800,000. 20 parts of dipentaerythritol monohydroxy pentaacrylate as a photopolymerizable compound and 1 part of α-hydroxy cyclohexyl phenyl ketone as a photopolymerization initiator were compounded with the acrylic polymer solution. The mixture was dissolved uniformly in toluene to prepare a solution containing a radiation-curing acrylic pressure-sensitive adhesive at a concentration of 25% by weight.

(Preparation of a Dicing/Die-Bonding Film)

The above radiation-curing acrylic pressure-sensitive adhesive solution was applied onto a polyethylene film of 60 μm in thickness as the supporting base material and dried to form a pressure-sensitive adhesive layer of 20 μm in thickness. Hereinafter, the resulting product is referred to as pressure-sensitive adhesive film (A). Only a wafer-attaching region of the pressure-sensitive adhesive layer in the pressure-sensitive adhesive film (A) was irradiated with UV rays in a total dose of 500 mJ/cm² to give a film having the pressure-sensitive adhesive layer whose wafer-attaching region had been cured by UV rays. Then, the above die-bonding adhesive layer (A) was transferred onto the pressure-sensitive adhesive layer of the pressure-sensitive adhesive film (A), to give a dicing/die-bonding film.

Example 2

A dicing/die-bonding film was prepared in the same manner as in Example 1 except that the die-bonding adhesive (B) was used in place of the die-bonding adhesive (A) in Example 1.

Example 3

(Preparation of a Radiation-Curing Acrylic Pressure-Sensitive Adhesive)

A composition consisting of 50 parts of ethyl acrylate, 50 parts of butyl acrylate and 16 parts of 2-hydroxyethyl acrylate was copolymerized in a toluene solvent, to give a solution containing an acrylic polymer at a concentration of 35% by weight having a weight-average molecular weight of 500,000. Then, 20 parts of 2-methacryloyloxyethyl isocyanate was subjected to addition polymerization with the acrylic polymer solution thereby introducing carbon-carbon double bonds into intramolecular side chains of the polymer. To 100 parts by weight (solids content) of this polymer were added 1 part by weight of a polyisocyanate-based crosslinking agent and 3 parts of an acetophenone-based photopolymerization initiator. These were dissolved uniformly in toluene to prepare a solution containing a radiation-curing acrylic pressure-sensitive adhesive at a concentration of 23% by weight.

(Preparation of a Dicing/Die-Bonding Film)

The above radiation-curing acrylic pressure-sensitive adhesive solution was applied onto a polyethylene film of 80 μm in thickness as the supporting base material and dried to form a pressure-sensitive adhesive layer of 5 μm in thickness. Hereinafter, the resulting product is referred to as pressure-sensitive adhesive film (B). Only a wafer-attaching region of the pressure-sensitive adhesive layer in the pressure-sensitive adhesive film (B) was irradiated with 500 mJ/cm UV rays to give a film having the pressure-sensitive adhesive layer whose wafer-attaching region had been cured by UV rays. Then, the above die-bonding adhesive layer (B) was transferred onto the pressure-sensitive adhesive layer of the pressure-sensitive adhesive film (B), to give a dicing/die-bonding film.

Example 4

A dicing/die-bonding film was prepared in the same manner as in Example 3 except that the die-bonding adhesive layer (C) was used in place of the die-bonding adhesive (B) in Example 3.

Example 5

A dicing/die-bonding film was prepared in the same manner as in Example 3 except that the die-bonding adhesive layer (A) was used in place of the die-bonding adhesive (B) in Example 3.

Example 6

Only a wafer-attaching region of the pressure-sensitive adhesive layer in the pressure-sensitive adhesive film (A) obtained in Example 1 was irradiated with UV rays in a total dose of 500 mJ/cm² to give a film having the pressure-sensitive adhesive layer whose wafer-attaching region had been cured by UV rays. Then, the above die-bonding adhesive layer (A) was transferred onto the wafer-attaching region of the pressure-sensitive adhesive layer in the pressure-sensitive adhesive film (A), to give a dicing/die-bonding film.

Example 7

Only a wafer-attaching region of the pressure-sensitive adhesive layer in the pressure-sensitive adhesive film (B) obtained in Example 3 was irradiated with UV rays in a total dose of 500 mJ/cm² to give a film having the pressure-sensitive adhesive layer whose wafer-attaching region had been cured by UV rays. Then, the above die-bonding adhesive layer (C) was transferred onto the wafer-attaching region of the pressure-sensitive adhesive layer in the pressure-sensitive adhesive film (B), to give a dicing/die-bonding film.

Comparative Example 1

A dicing/die-bonding film was prepared in the same manner as in Example 1 except that the pressure-sensitive adhesive layer in the pressure-sensitive adhesive film (A) was not irradiated with UV rays.

Comparative Example 2

A dicing/die-bonding film was prepared in the same manner as in Example 1 except that the pressure-sensitive adhesive layer on the t pressure-sensitive adhesive film (A) was not irradiated with UV rays, and also that the die-bonding adhesive layer (A) after being transferred onto the pressure-sensitive adhesive layer was irradiated with 500 mJ/cm² UV rays.

With respect to the dicing/die-bonding films obtained in the Examples and Comparative Examples, the pressure-sensitive adhesive films and the die-bonding adhesive layers used in the respective examples were measured for their adhesion in the following manner. The results are shown in Table 2.

(1) Measurement of the Adhesion Between the Die-Bonding Adhesive Layer and the Pressure-Sensitive Adhesive Film (Pressure-Sensitive Adhesive Layer)(Wafer-Attaching Region)

The pressure-sensitive adhesive film used in each example was irradiated in the side of the supporting base material with UV rays (500 mJ/cm²) and cut into rectangular strips of 10 mm in width. Separately, the die-bonding adhesive layer used in each example was stuck onto a 6-inch silicon wafer (ground surface #2000) placed on a hot plate at 40° C. Thereafter, the pressure-sensitive adhesive film (10 mm in width) was stuck onto the die-bonding adhesive layer at room temperature (23° C.) and left for 30 minutes in a room-temperature atmosphere, and the adhesion of the pressure-sensitive adhesive film when peeled off at a peel angle of 90° in a thermostat chamber at 23° C. was measured (stress rate of the pressure-sensitive adhesive film, 300 mm/min.). However, the pressure-sensitive adhesive film used in Comparative Example 1 was measured for adhesion without irradiation with UV rays. The pressure-sensitive adhesive film used in Comparative Example 2 was irradiated with UV rays after attachment to the die-bonding adhesive layer.

(Region Other Than the Wafer-Attaching Region)

The pressure-sensitive adhesive film used in each of the Examples and Comparative Examples was cut into rectangular strips of 10 mm in width. Separately, the die-bonding adhesive layer used in each of the Example and Comparative Examples was stuck onto a 6-inch silicon wafer (ground surface #2000) placed on a hot plate at 40° C. Thereafter, the pressure-sensitive adhesive film (10 mm in width) was stuck onto the die-bonding adhesive layer at room temperature (23° C.) and left for 30 minutes in a room-temperature atmosphere, and the adhesion of the pressure-sensitive adhesive film when peeled off at a peel angle of 90° in a thermostat chamber at 23° C. was measured (stress rate of the pressure-sensitive adhesive film, 300 mm/min.).

(2) Measurement of the Adhesion of the Die-Bonding Adhesive Layer to a Dicing Ring and a Wafer The region, on which a wafer was not stuck, of the dicing/die-bonding film obtained in each of the Examples and Comparative Examples was irradiated in the side of the supporting base material with UV rays (500 mJ/cm$^2$) and then cut into rectangular strips of 10 mm in width. The dicing/die-bonding film (10 mm in width) was stuck onto a dicing ring (2-6-1 (Disco)) and a wafer (ground surface #2000) at 23° C. (room temperature) and then left in a room-temperature atmosphere for 30 minutes, and the adhesion of the pressure-sensitive adhesive film when peeled off at a peel angle of 90° in a thermostat chamber at 23° C. was measured (stress rate of the dicing/die-bonding film, 300 mm/min.).

(3) Measurement of the Adhesion of the Pressure-Sensitive Adhesive Film to an SUS304 Plate (#2000 Polishing)(Wafer-Attaching Region)

Each of the pressure-sensitive adhesive films A and B was irradiated in the side of the supporting base material with UV rays (500 mJ/cm$^2$) and then cut into rectangular strips of 10 mm in width. Thereafter, the pressure-sensitive adhesive film (100 mm width) was stuck onto an SUS304 plate (#2000 polishing) at room temperature (23° C.) and left for 30 minutes in a room-temperature atmosphere, and the adhesion of the pressure-sensitive adhesive film when peeled off at a peel angle of 90° in a thermostat chamber at 23° C. was measured (stress rate of the pressure-sensitive adhesive film, 300 mm/min.).

(Region Other Than the Wafer-Attaching Region)

Each of the pressure-sensitive adhesive films A and B was cut into rectangular strips of 10 mm in thickness. Thereafter, the pressure-sensitive adhesive film (10 mm) was stuck onto an SUS304 plate (#2000 polishing) at room temperature (23° C.) and left for 30 minutes in a room-temperature atmosphere, and the adhesion of the pressure-sensitive adhesive film when peeled off at a peel angle of 90° in a thermostat chamber at 23° C. was measured (stress rate of the pressure-sensitive adhesive film, 300 mm/min.).

The dicing/die-bonding films in Examples 1 to 7 and Comparative Example 1 and 2 were evaluated for their performance in actual dicing/die-bonding of semiconductor wafers in the following manner. The results are shown in Table 2.

<Chip Scattering During Dicing>

A mirror wafer of 0.15 mm in thickness with a circuit pattern formed thereon, obtained by grinding the back of a semiconductor wafer having a diameter of 8 inches, was used. The separator was released from the dicing/die-bonding film, and the mirror wafer was contact-bonded by pressing a roller at 40° C. to the exposed adhesive layer and then subjected to full-dicing into 1×1 mm square chips. Whether the chip scattering during dicing was examined. In this procedure, none of the dicing/die-bonding films in the Examples and Comparative Examples caused failure such as chips scattering during dicing.

<Pickup>

Full-dicing was carried out in the same manner as described above except that the size of the square chips was changed into 5×5 mm, 10×10 mm, and 15×15 mm respectively. Thereafter, the silicon chips (chipped wafer) were picked up in a system for raising the side of the supporting base material by a needle. "o" was given to successful pickup, and "x" was given to unsuccessful pickup.

(Dicing Conditions)
Dicing unit: DFD-651 manufactured by Disco.
Dicing rate: 80 mm/sec.
Dicing blade: 2050HECC manufactured by Disco.
Number of rotation: 40,000 mm
Cut depth: 20 μm
Cut system: Full cut/mode A
Chip size: arbitrary (1×1 mm to 15×15 mm square)
(Wafer Grinding Conditions)
Grinding unit: DFG-840 manufactured by Disco.
Wafer: 6-inch diameter (grinding of the back from 0.6 mm, to 0.15 μm)
Wafer-attaching unit: DR-8500II (Nitto Seiki Co., Ltd.)
(Expanding Conditions)
Dicing ring: 2-6-1 (Internal diameter 19.5 cm, manufactured by Disco)
Drawdown: 5 mm
Die bonder: CPS-100 (NEC Kikai)

TABLE 2

| | | Example 1 | Example 2 | Example 3 | Example 4 | Example 5 | Example 6 | Example 7 | Comparative Example 1 | Comparative Example 2 |
|---|---|---|---|---|---|---|---|---|---|---|
| Die-bonding adhesive | Type | A | B | B | C | A | A | C | A | A |
| | Thickness (μm) | 20 | 20 | 20 | 20 | 20 | 20 | 20 | 20 | 20 |
| Pressure-sensitive adhesive film | Type | A | A | B | B | B | A | B | A | A |
| | Thickness (μm) | 80 | 80 | 85 | 85 | 85 | 80 | 85 | 80 | 80 |
| Irradiation of the wafer-attaching region with UV rays | Before attachment of wafer | present | present | present | present | present | present | present | absent | absent |
| | After attachment of wafer | absent | absent | absent | absent | absent | absent | absent | absent | present |
| (1) Adhesion between the die-bonding adhesive layer and the pressure-sensitive adhesive film (N/10 mm) | Wafer-attaching region | 0.15 | 0.08 | 0.09 | 0.12 | 0.26 | 0.15 | 0.12 | 5.5 | 25 |
| | Other region than wafer-attaching region | 3.3 | 2.35 | 3.8 | 4.8 | 3.55 | — | — | 5.5 | 3.3 |

TABLE 2-continued

|  |  | Example 1 | Example 2 | Example 3 | Example 4 | Example 5 | Example 6 | Example 7 | Comparative Example 1 | Comparative Example 2 |
|---|---|---|---|---|---|---|---|---|---|---|
| (2) Adhesion of the die-bonding adhesive layer (N/10 mm) | Wafer | 17.5 | 16.2 | 16.2 | 21.5 | 17.5 | 17.5 | 21.5 | 17.5 | 17.5 |
|  | Dicing ring | 1.25 | 1.1 | 1.1 | 1.9 | 1.25 | — | — | 1.25 | 1.25 |
| (3) Adhesion of the pressure-sensitive adhesive film to SUS304 (N/10 mm) | Wafer-attaching region | — | — | — | — | — | 0.05 | 0.09 | — | — |
|  | Other region than wafer-attaching region | — | — | — | — | — | 8.5 | 5.7 | — | — |
| Chip scattering | Dicing/1 × 1 mm square | none | none | none | none | none | none | none | none | none |
| Pickup | Dicing/5 × 5 mm square | ○ | ○ | ○ | ○ | ○ | ○ | ○ | ○ | x |
|  | Dicing/10 × 10 mm square | ○ | ○ | ○ | ○ | ○ | ○ | ○ | x | x |
|  | Dicing/15 × 15 mm square | ○ | ○ | ○ | ○ | ○ | ○ | ○ | x | x |

None of the dicing/die-bonding films in the Examples and the Comparative Examples showed failure in dicing. All chips could be well picked up from the dicing/die-bonding films in the Examples, while in Comparative Example 1, 10×10 mm square and 15×15 mm square chips could not be picked up, and in Comparative Example 2, 5×5 mm square, 10×10 mm square and 15×15 mm square chips could not be picked up. As is evident from the these test results, the dicing/die-bonding film having a pressure-sensitive adhesive layer between a supporting base material and an adhesive layer wherein the adhesion between the adhesive layer and the pressure-sensitive adhesive layer is lower in the wafer-attaching region than in the other region (region onto which a wafer is not stuck) has the adhesion thereof to a dicing ring without failure in dicing, and chips of various sizes can be picked up well.

What is claimed is:

1. A dicing/die-bonding film comprising a pressure-sensitive adhesive layer on a supporting base material and a die-bonding adhesive layer on the pressure-sensitive adhesive layer, wherein
    the die-bonding adhesive layer is arranged as a work-attaching region on a part of the pressure-sensitive adhesive layer, and
    a region (a) corresponding to the work-attaching region in the pressure sensitive adhesive layer and a region (b) other than the region (a) are different in adhesion and satisfy the relationship:
    the adhesion of the region (a) is lower than the region (b),
    wherein adhesion of said region (a) of the pressure-sensitive adhesive layer is 0.01 to 0.5 N/20 mm and the adhesion of said region (b) of the pressure-sensitive adhesive layer is 0.5 to 20 N/20 mm.

2. The dicing/die-bonding film according to claim 1, wherein adhesion of the work-attaching region to the work and to the region (a) satisfies the relationship:
    the adhesion to the work is higher than the adhesion to the region (a).

3. The dicing/die-bonding film according to claim 1, wherein the pressure-sensitive adhesive layer is made of a radiation-curing pressure-sensitive adhesive, and the region (a) corresponding to the work-attaching region is irradiated with radiations.

4. The dicing/die-bonding film according to claim 1, wherein the die-bonding adhesive layer comprises a work-attaching region, and wherein adhesion of the work-attaching region of the die-bonding adhesive layer to said region (a) of the pressure-sensitive adhesive layer is no more than 0.01 to 0.5 N/20 mm, and adhesion of the work-attaching region of the die-bonding adhesive layer to a work is no more than 10 to 50 N/20 mm.

5. The dicing/die-bonding film according to claim 1, wherein the die-bonding adhesive layer comprises a work-attaching region but does not comprise a region other than the work-attaching region.

6. The dicing/die-bonding film according to claim 1, wherein said region (a) of the pressure-sensitive adhesive layer has been irradiated with radiation selectively relative to said region (b) of the pressure-sensitive adhesive layer.

7. The dicing/die-bonding film according to claim 1, wherein the whole surface of said region (a) of the pressure-sensitive adhesive layer has been irradiated.

* * * * *

UNITED STATES PATENT AND TRADEMARK OFFICE
CERTIFICATE OF CORRECTION

| | | |
|---|---|---|
| PATENT NO. | : 7,646,103 B2 | Page 1 of 1 |
| APPLICATION NO. | : 11/369931 | |
| DATED | : January 12, 2010 | |
| INVENTOR(S) | : Matsumura et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 832 days.

Signed and Sealed this

Twenty-eighth Day of December, 2010

David J. Kappos
*Director of the United States Patent and Trademark Office*

UNITED STATES PATENT AND TRADEMARK OFFICE
CERTIFICATE OF CORRECTION

PATENT NO. : 7,646,103 B2
APPLICATION NO. : 11/369931
DATED : January 12, 2010
INVENTOR(S) : Takeshi Matsumura et al.

It is certified that error appears in the above-identified patent and that said Letters Patent is hereby corrected as shown below:

Title Page, On Page 2, Item 56, above "EP 1411547 A2* 4/2004" please delete "EP 1 411 547 A2 4/2004".

At Column 6, Line 10, please delete "the. Pressure" and insert --the pressure--, therefor.

At Column 15, Line 43 (approximately), please delete "500 mJ/cm" and insert --500 mJ/cm$^2$--, therefor.

Signed and Sealed this
Tenth Day of May, 2011

David J. Kappos
*Director of the United States Patent and Trademark Office*